United States Patent [19]

Maruyama

[11] Patent Number: 5,164,327
[45] Date of Patent: Nov. 17, 1992

[54] METHOD OF MANUFACTURING A MIS-TYPE SEMICONDUCTOR

[75] Inventor: Kazumi Maruyama, Matsumoto, Japan

[73] Assignee: Fuji Electric Co., Ltd., Kawasaki, Japan

[21] Appl. No.: 772,856

[22] Filed: Oct. 8, 1991

[30] Foreign Application Priority Data

Oct. 16, 1990 [JP] Japan ................. 2-277460

[51] Int. Cl.$^5$ ............................................. H01L 21/70
[52] U.S. Cl. .................................. 437/40; 437/27; 437/28; 437/29; 437/228; 437/229
[58] Field of Search .............. 437/20, 40, 41, 27, 437/28, 228, 235, 229; 357/23.4

[56] References Cited

U.S. PATENT DOCUMENTS

| | | | |
|---|---|---|---|
| 4,417,385 | 11/1983 | Temple | 357/234 |
| 4,757,032 | 7/1988 | Contiero | 357/23.4 |
| 4,774,198 | 9/1988 | Contiero et al. | 437/29 |
| 4,883,767 | 11/1989 | Gray et al. | 357/23.4 |
| 4,972,239 | 11/1990 | Mihara | 357/23.4 |
| 5,023,191 | 6/1991 | Sakurai | 437/29 |

FOREIGN PATENT DOCUMENTS

| | | | |
|---|---|---|---|
| 0119400 | 9/1984 | European Pat. Off. | 357/23.4 |
| 0043740 | 2/1990 | Japan | 437/29 |

*Primary Examiner*—Tom Thomas
*Attorney, Agent, or Firm*—Parkhurst, Wendel & Rossi

[57] ABSTRACT

A method of manufacturing an MIS-type semiconductor is disclosed in which an insulation layer is deposited over a semiconductor drain layer of a first conduction type and a contact region of a high concentration second conduction type, a base region of the second conduction type, and a source region of the first conduction type within the base region in the semiconductor drain layer are formed by ion injecting through the insulation layer. Performing the ion injections through the insulation layer prevents ion injection damage to the surface of the drain layer. Furthermore, since the insulation layer is formed prior to the introduction of impurities, which generate high-density crystalline defects, quality degradation in the insulation layer itself can be kept to a minimum.

2 Claims, 5 Drawing Sheets

METHOD OF MANUFACTURING A MIS-TYPE SEMICONDUCTOR

FIELD OF THE INVENTION

The present invention relates to a method of manufacturing a semiconductor device with an MIS (Metal Insulator Semiconductor) structure, and more particularly to a manufacturing method suitable for the formation of a vertical-double diffusion MOSFET for power use, and an IGBT (Insulation Gate Bipolar Transistor).

BACKGROUND

Conventional vertical-double diffusion MOSFETs with a large current capacity for power use, as shown in FIG. 3, and IGBTs taking advantage of the conductivity modulation via a carrier injection, as shown in FIG. 4, have a structure in which a p-type base region (6) and a n+-type source region (8) both formed on the surface side of an n-type drain layer through a double diffusion process. The methods used to manufacture these devices have many points in common.

The conventional manufacturing method for these structures, which are shown in FIG. 3 and 4, includes first forming an n+-type drain layer (1) on an n+-type layer (2) that has been formed on a p+-type silicon substrate (10). Next a p+-type contact region (3) is formed on the surface of this drain layer (1), which is covered with a gate oxide film (41), and gate electrodes (5) are formed on the gate oxide film (41). After removing the gate oxide film (41) around the gate electrodes (5), the p-type base region (6) is formed by diffusion using a self-aligning process using the gate electrodes as a mask, while, in the case of the IGBT, a low p+-type resistance region (7) is further formed in the base region (6). Thereafter, using the gate electrodes (5) again as a mask, the n+-type source regions (8) are formed, their surfaces are covered with oxide films (42), and the surfaces of the contact region and source regions are opened to form a source electrode (11). A drain electrode (12) is formed on the back surface of the silicon substrate (2) and the other silicon substrate (10) have a drain electrode (12).

The above-described conventional manufacturing methods have the following problems. Specially, in switching elements that have a MOS structure represented by a vertical-double diffusion MOSFET and an IGBT, it is very important to raise the quality of gate insulation films, and suppress crystalline defects in the semiconductor layer immediately below the gate oxide films in order to improve and stabilize the element characteristics. However, in the above manufacturing methods, in which highly concentrated B ions are introduced through an ion-injection process, and then heat treatment is carried out to form the contact region (3), injection damage resulting therefrom causes crystalline defects on the surface of the drain layer (1) and around its vicinity. The quality of gate oxide films is therefore degraded and many crystalline defects remain in the region immediately below the gate oxide films. As a result, break-downs of the gate oxide films, short circuits between the gate and the drain, and other failures develop frequently, thereby reducing the element yield.

Alternatively, a method is used wherein the surface of the drain layer (1) is initially covered with an oxide film with a thickness of approximately 500 A, through which an ion injection is introduced to prevent contamination of the surface of the drain layer (1) and ion damage; however, this method requires an extra process to form the oxide film.

A further method is available in which a highly concentrated defective region is formed intentionally on the rear side of the drain layer (1) through an ion injection process or the like to reduce the contaminants and damage on the surface of the drain layer (1). This method, however, requires several separate processes.

It is an object of the present invention to solve these problems by suppressing the generation of contamination and defects on the gate oxide films, and in the region immediately below the films, while improving and stabilizing the element characteristics, and enhancing the element yield by forming respective regions in the drain layer with the surface of the drain layer (1) covered, without increasing the number of production processes.

SUMMARY OF THE INVENTION

The present invention provides a method to manufacture a MIS-type semiconductor, wherein a base region of second conduction type is provided on the surface of a semiconductor layer of the first conduction type, as well as a source region of first conduction type in the base region, a contact region of second conduction type with a high concentration is formed from the surface of a non-forming region of the source region within the base region. Then using the surface side of the base region between the semiconductor layer and the source region as a channel region, gate electrodes are placed on the surface of the channel region via the gate insulation film. The present invention applies the following means to solve the above problems:

After forming the gate insulation films, impurities are introduced from above these insulation films to subsequently form a base region, contact region, and source region. More specifically, the manufacturing method may include:

1. A process to selectively form gate electrodes on a gate insulation film;
2. A process to form a contact region through the gate insulation film via a mask formed on the gate insulation film;
3. A process to form a base region through the gate insulation film using the gate electrodes as mask;
4. A process to form a source region through the gate insulation film via masks formed on the gate electrodes and gate insulation film;

The manufacturing method may further include:

1. A process to form a contact region through the gate insulation film via a mask formed on the gate insulation film;
2. A process to selectively form gate electrodes on a gate insulation film;
3. A process to form a base region through the gate insulation film using the gate electrodes as a mask;
4. A process to form a source region through the gate insulation film via masks formed on the gate electrodes and gate insulation film.

With this method, after the gate insulation film is first formed on the surface of a semiconductor layer with its entire surface covered, impurities are introduced into the semiconductor layer through this gate insulation film via an ion injection process, while the gate insulation film performs the function of a screen to prevent surface contamination and injection damage to the semiconductor layer. In addition, since this gate insulation film is formed prior to the ion injection, any defect that may be created on the surface as a result of heat treatment after the ion injection cannot extend to include the gate insulation film itself. As a result, quality degradation in the gate insulation film itself is kept to a minimum. Furthermore, because the gate insulation film is used as a screen, there is no need to freshly form surface oxide films, which allows for a reduction in the number of manufacturing process. It is therefore possible to improve and stabilize the element characteristics, while enhancing the element yield.

BRIEF DESCRIPTION OF THE DRAWINGS

With the above as background, reference should now be made to the following detailed description of the preferred embodiments and the accompanying drawings, in which.

DETAILED DESCRIPTION OF THE PREFERRED EMBODIMENTS

Figure 1A:
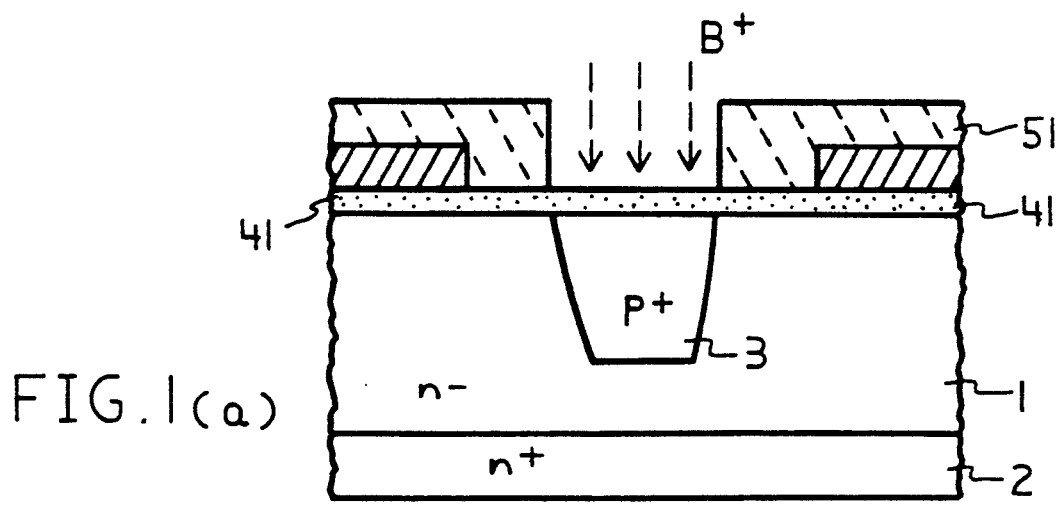
FIGS. 1(a)-1(e) represent cross-sectional views of an MIS-type semiconductor device manufactured in accordance with a first embodiment of the present invention.
Figure 1B:
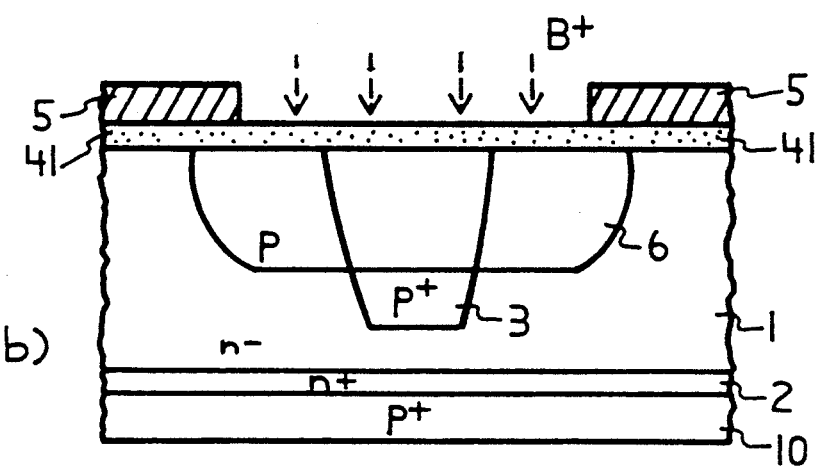
Figure 1C:
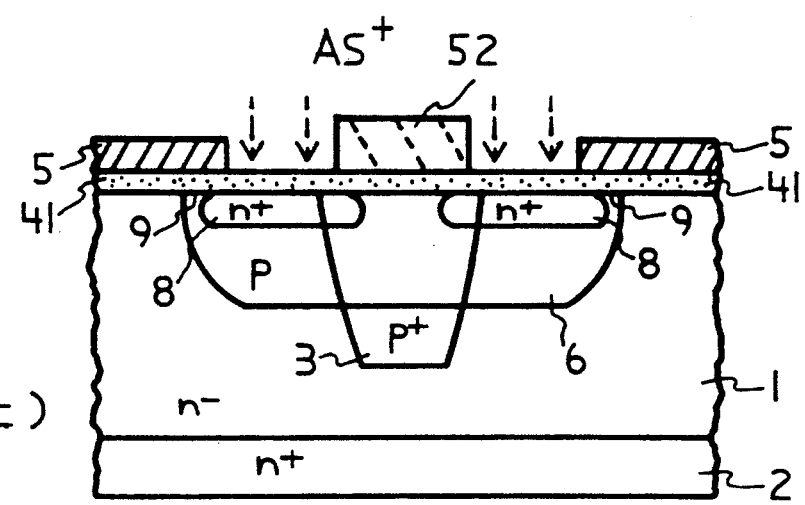
Figure 1D:
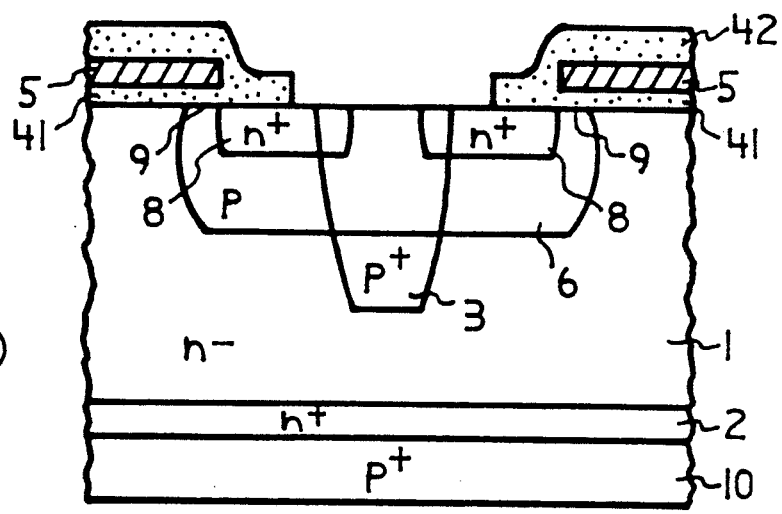
Figure 1E:
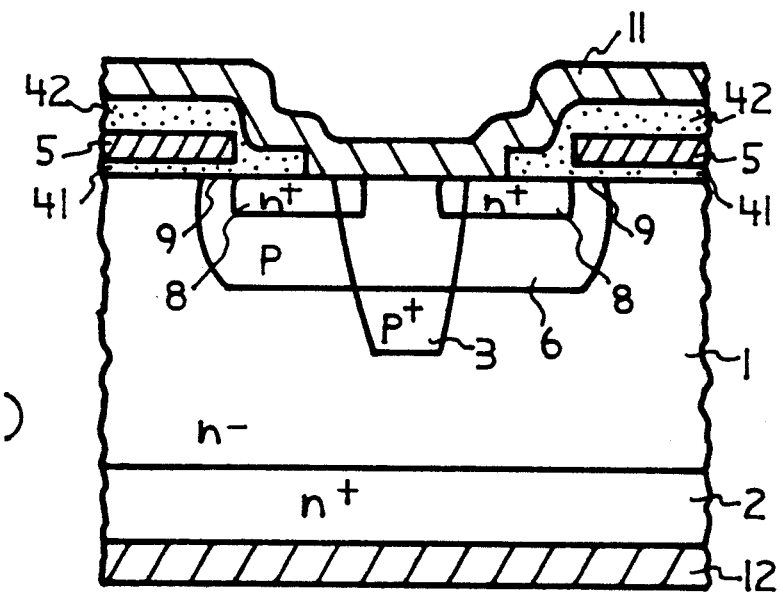

FIG. 1 shows a method of manufacturing a vertical-double diffusion MOSFET in accordance with the present invention. An n+-type drain layer (1) is formed on an n+-type silicon substrate (2) by means of epitaxial growth, the surface of the drain layer (1) being formed with a gate oxide film 41 with a thickness between 100 and 2000 A. On the surface of this oxide film (41), a resist layer (51) is formed by using a photolithographic process, and B+ is injected while using the layer as a mask. This ion injection is carried out at a predetermined accelerating voltage, considering the thickness of the gate oxide film (41) (FIG. 1 (a)). Next, after removing the resist layer (51), an annealing treatment is carried out to form a p-type contact region (3), while in this condition, B+ is ion injected using gate electrodes as a mask, and an annealing treatment is carried out to form a p-type base region (6) (FIG. 1 (b)). Thereafter, a resist layer (52) is formed on the surface of the contact region (3), and As+ is injected using the resist layer (52) and the gate electrodes as masks to form an n+-type source region (8) (FIG. 1 (c)). Then, oxide film (42) is formed, parts of the surfaces of the contact region (3) and source region (8) are opened, and a source electrode (11) is formed on this opening. A silicon substrate (2) has a drain electrode (12) formed on its back. According to this embodiment, the screening function of the oxide film, which has conventionally been formed independently, is performed by the gate oxide film (41), thereby eliminating the need to freshly form an oxide film, thereby resulting in the reduction of the number of steps required in the manufacturing process. Performing ion injections through this gate oxide film (41) prevents ion injection damage to the surface of the drain layer (1), and because the oxide film is formed prior to the ion injection process, degradation in its quality can be suppressed and kept at the minimum.

Figure 2A:
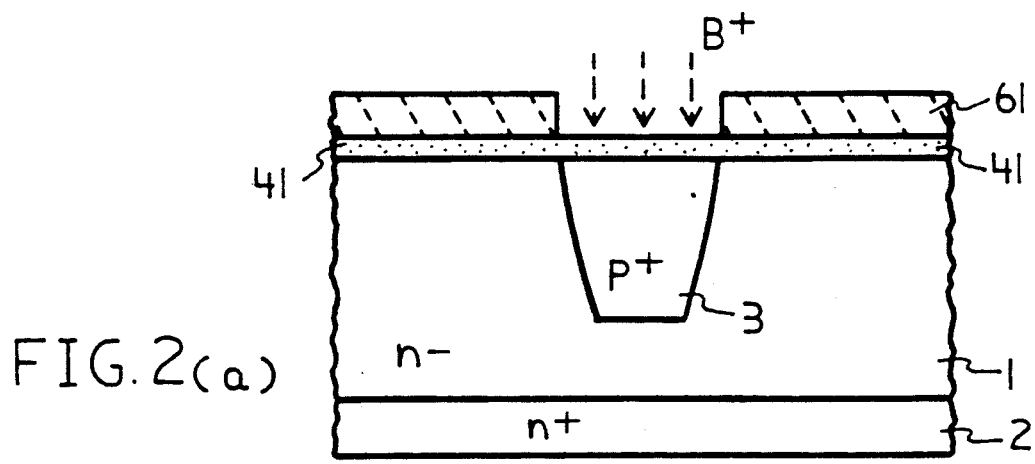
FIGS. 2(a)-(e) represent cross-sectional views of an MIS-type semiconductor device manufactured in accordance with a second embodiment of the present invention.
Figure 2B:
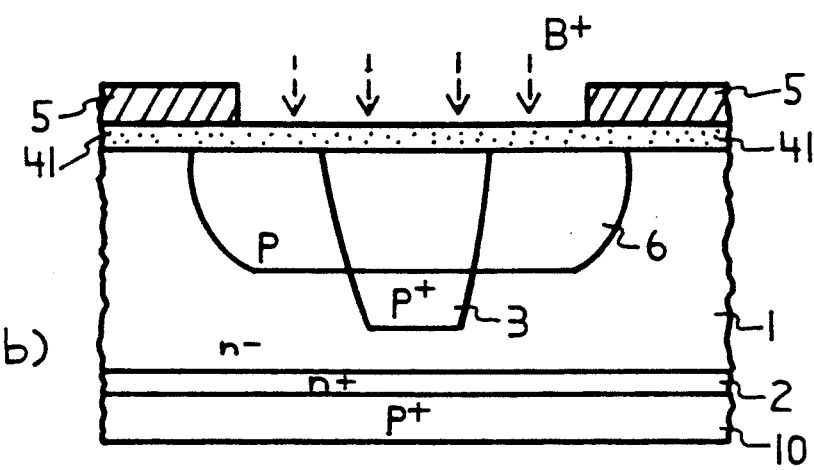
Figure 2C:
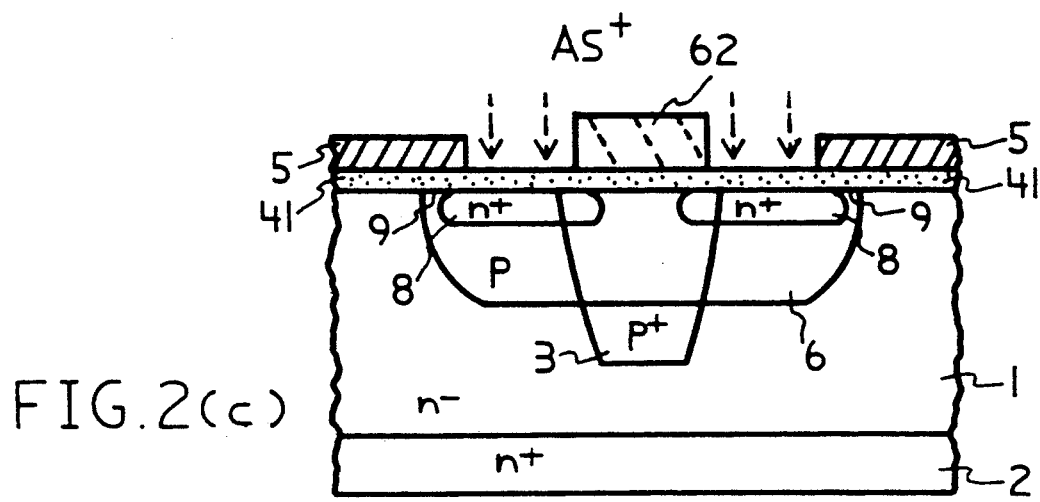
Figure 2D:
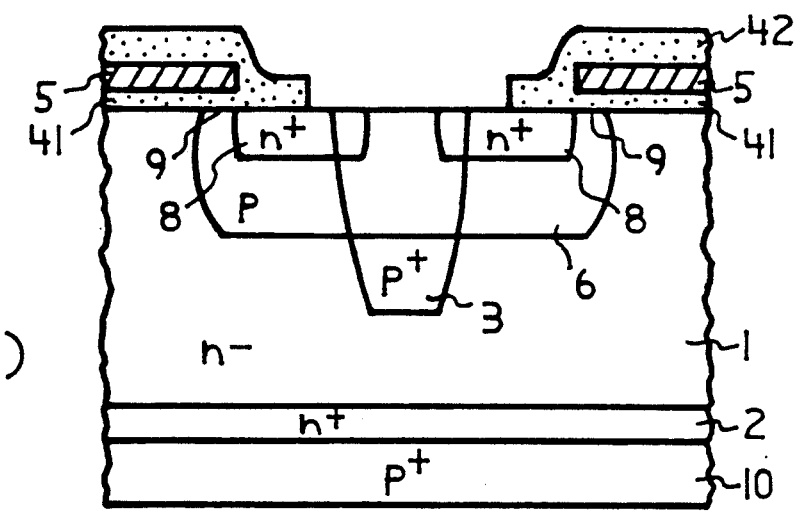
Figure 2E:
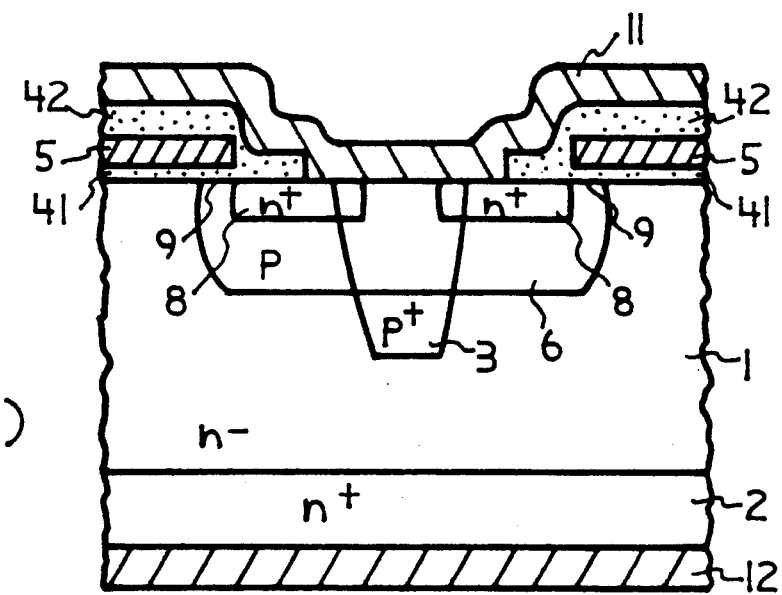
Figure 3:
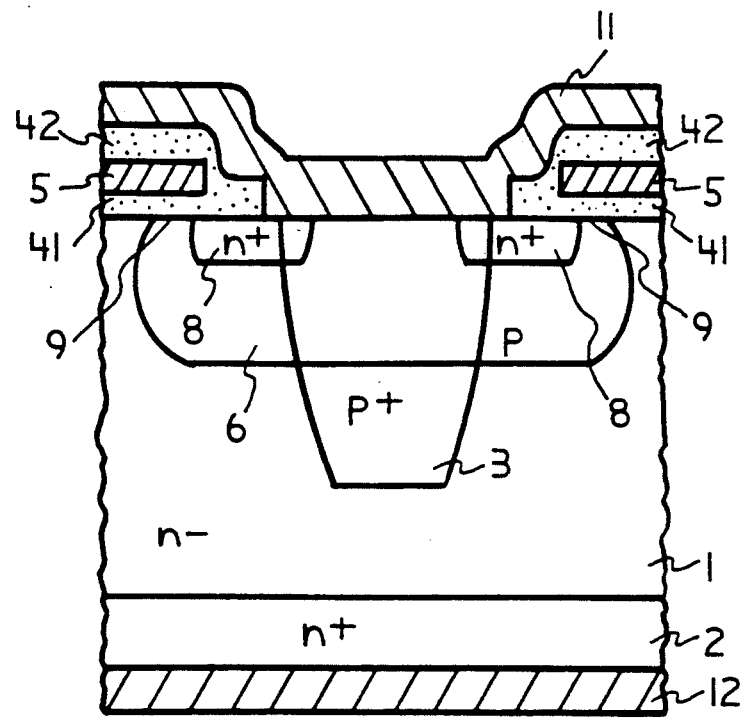
FIG. 3 is a cross-sectional view illustrating the structure of a conventional vertical-double diffusion MOSFET.
Figure 4:
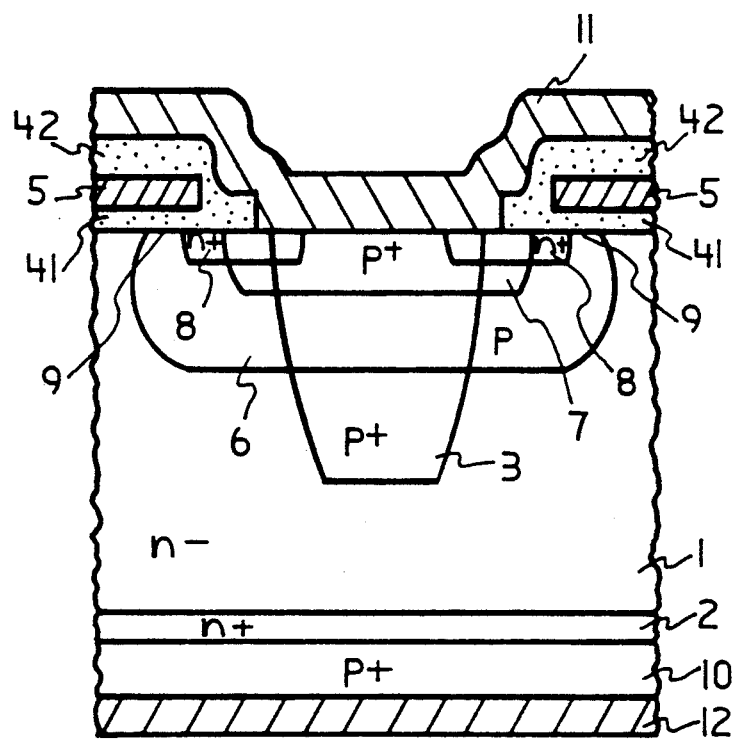
FIG. 4 is a cross-sectional view illustrating the structure of a conventional gate-type bipolar transistor.

A manufacturing method in accordance with a second embodiment of the present invention is illustrated in FIGS. 2(a-e). In this embodiment, an oxide film (41) is first formed on the surface of a drain layer (1), which is the same as that in the first embodiment, while ions are injected using a resist layer (61) formed directly on the gate oxide film (41) as a mask to form a contact region (3) (FIG. 2 (a)). Next, after removing the resist layer (61), a gate electrode (5) is formed, and a base region (6) is formed while using the gate electrode as a mask (FIG. 2 (b)). Thereafter, in the same manner as in the first embodiment, an n+-type source region (8) is formed by using a resist layer (62) and gate electrode (5) as a mask (FIG. 2 (c)), and unnecessary oxide films are removed (FIG. 2 (d)) to form a source electrode (11) and a drain electrode (12) (FIG. 2 (e)).

In this embodiment, because the contact region (3), base region (6), and source region (8), are formed by an ion injection from above the gate oxide film, as in the first embodiment, any injection damage to the area directly below the gate oxide film can be prevented without increasing the number of manufacturing process steps. Moreover, the quality degradation of the gate oxide film can be minimized.

As described above, the present invention is characterized as a method to manufacture an MIS-type semiconductor by first forming a gate insulation film on a semiconductor layer, and then introducing impurities through this gate oxide film to form the contact region, base region, and source region. Performing the ion injections through a gate oxide film prevents ion injection damage to the surface of the drain layer. Furthermore, since the oxide film is formed prior to the introduction of impurities, which generate high-density crystalline defects, quality degradation in the gate oxide film itself can be kept to a minimum. It is therefore possible to achieve a reduction of manufacturing costs, by improving and stabilizing the element characteristics, and enhancement of the element yield.

What is claimed is:

1. A method of manufacturing an MIS-type semiconductor device consisting of: forming a drain layer of a first conduction type on a first surface of a semiconductor substrate of a first conduction type; forming a first insulation layer on the drain layer; forming gate electrodes on the first insulation layer; forming a first mask over the gate electrodes and a portion of the first insulation layer to define a location for a contact region; forming the contact region of a high concentration second conduction type to a first depth within the semiconductor layer by injecting ions through the first insulation layer at the location defined by the first mask and performing an annealing operation after removing the first mask; forming a base region of the second conduction type to a second depth within the semiconductor layer that is less than the first depth by using the gate electrodes as a mask, injecting ions through the first insulation layer and performing an annealing operation; forming a second mask on the first insulation layer between the gate electrodes to define a location for a source region; forming a source region of the first conduction type by injecting ions through the first insulation layer at the location defined by the second mask; removing the second mask; forming a second insulation layer over the gate electrodes and the first insulation layer; forming and opening through the first and second insulation layers to expose parts of the surfaces of the contact region and the source region; forming a source electrode on the exposed surfaces of the contact regions and the source region; and forming a drain electrode on a second surface of the semiconductor substrate.

2. A method of manufacturing an MIS-type semiconductor device consisting of: forming a drain layer of a first conduction type on a first surface of a semiconductor substrate of a first conduction type; forming a first insulation layer on the drain layer; forming a first mask over selected portions of the first insulation layer to define a location for a contact region; forming the contact region of a high concentration second conduction type to a first depth within the semiconductor layer by injecting ions through the first insulation layer at the location defined by the first mask and performing an annealing operation after removing the first mask; forming gate electrodes on the first insulation layer; forming a base region of the second conduction type to a second depth within the semiconductor layer that is less than the first depth by using the gate electrodes as a mask, injecting ions through the first insulation layer and performing an annealing operation; forming a second mask on the first insulation layer between the gate electrodes to define a location for a source region; forming a source region of the first conduction type by injecting ions through the first insulation layer at the location defined by the second mask; removing the second mask; forming a second insulation layer over the gate electrodes and the first insulation layer; forming and opening through the first and second insulation layers to expose parts of the surfaces of the contact region and the source region; forming a source electrode on the exposed surfaces of the contact regions and the source region; and forming a drain electrode on a second surface of the semiconductor substrate.

* * * * *